United States Patent
Hirschfeld et al.

(10) Patent No.: US 8,922,229 B2
(45) Date of Patent: Dec. 30, 2014

(54) METHOD FOR MEASUREMENT OF A POWER DEVICE

(75) Inventors: Botho Hirschfeld, Dresden (DE); Stojan Kanev, Thiendorf OT Sacka (DE)

(73) Assignee: Cascade Microtech, Inc., Beaverton, OR (US)

( * ) Notice: Subject to any disclaimer, the term of this patent is extended or adjusted under 35 U.S.C. 154(b) by 414 days.

(21) Appl. No.: 13/380,484

(22) PCT Filed: Jun. 16, 2010

(86) PCT No.: PCT/EP2010/058440
§ 371 (c)(1),
(2), (4) Date: Mar. 6, 2012

(87) PCT Pub. No.: WO2010/149551
PCT Pub. Date: Dec. 29, 2010

(65) Prior Publication Data
US 2012/0146676 A1 Jun. 14, 2012

(30) Foreign Application Priority Data
Jun. 22, 2009 (DE) .......................... 10 2009 030 043

(51) Int. Cl.
*G01R 31/26* (2014.01)
*G01R 31/40* (2014.01)
*G01R 31/28* (2006.01)
*G01R 31/20* (2006.01)

(52) U.S. Cl.
CPC ................................. *G01R 31/2891* (2013.01)
USPC .............. 324/754.01; 324/750.1; 324/750.33; 324/754.03; 324/756.02; 324/756.05

(58) Field of Classification Search
CPC ............ G01R 31/001–31/005; G01R 31/2891; G01R 31/00–31/05
USPC ......................... 324/754.01–754.03, 537–538
See application file for complete search history.

(56) References Cited

U.S. PATENT DOCUMENTS 3,848,188 A * 11/1974 Ardezzone et al. ........... 714/744
5,315,237 A * 5/1994 Iwakura et al. .......... 324/754.11
(Continued)

FOREIGN PATENT DOCUMENTS

EP 1 007 980 B1 4/2003

OTHER PUBLICATIONS

English-language abstract of European Patent No. EP 1 007 980 B1, May 12, 2011, downloaded from http://worldwide.espacenet.com on Dec. 15, 2011.

*Primary Examiner* — Jermele M Hollington
*Assistant Examiner* — Emily Chan
(74) *Attorney, Agent, or Firm* — Dascenzo Intellectual Property Law, P.C.

(57) ABSTRACT

A method is disclosed for the measurement of a power device in a prober, which serves the examination and testing of such components. In the process, a power device is held by a chuck, and at least one electric probe is held by a probe holder, and optionally, the power device or the probe is positioned each relative to the other using a positioning device with an electrical drive, and contacts the power device. At the same time, an electrical connection remains between the probe to a signal unit with which a power signal is sent out or received, is blocked and only unblocked when it is determined that the contact between probe 26 and contact area is established.

19 Claims, 2 Drawing Sheets

(56) References Cited

U.S. PATENT DOCUMENTS

Figure 1:
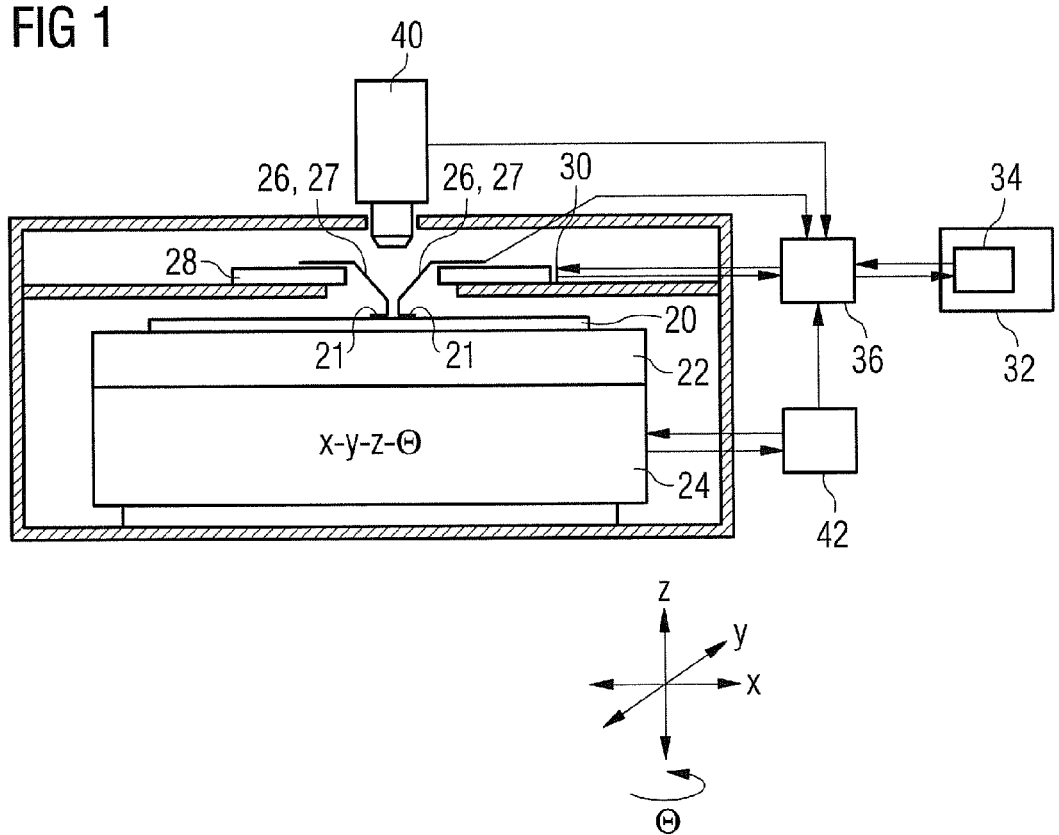

| | | |
|---|---|---|
| 5,742,173 A | 4/1998 | Nakagomi et al. |
| 7,573,283 B2 * | 8/2009 | Schmidt et al. .......... 324/750.16 |
| 2003/0141861 A1 | 7/2003 | Navratil et al. |
| 2008/0024159 A1 * | 1/2008 | Tilbor et al. ................. 324/99 R |
| 2008/0054917 A1 * | 3/2008 | Henson et al. ................ 324/754 |
| 2008/0136432 A1 * | 6/2008 | Chraft et al. .................. 324/755 |
| 2008/0290882 A1 | 11/2008 | Rogers et al. |

* cited by examiner

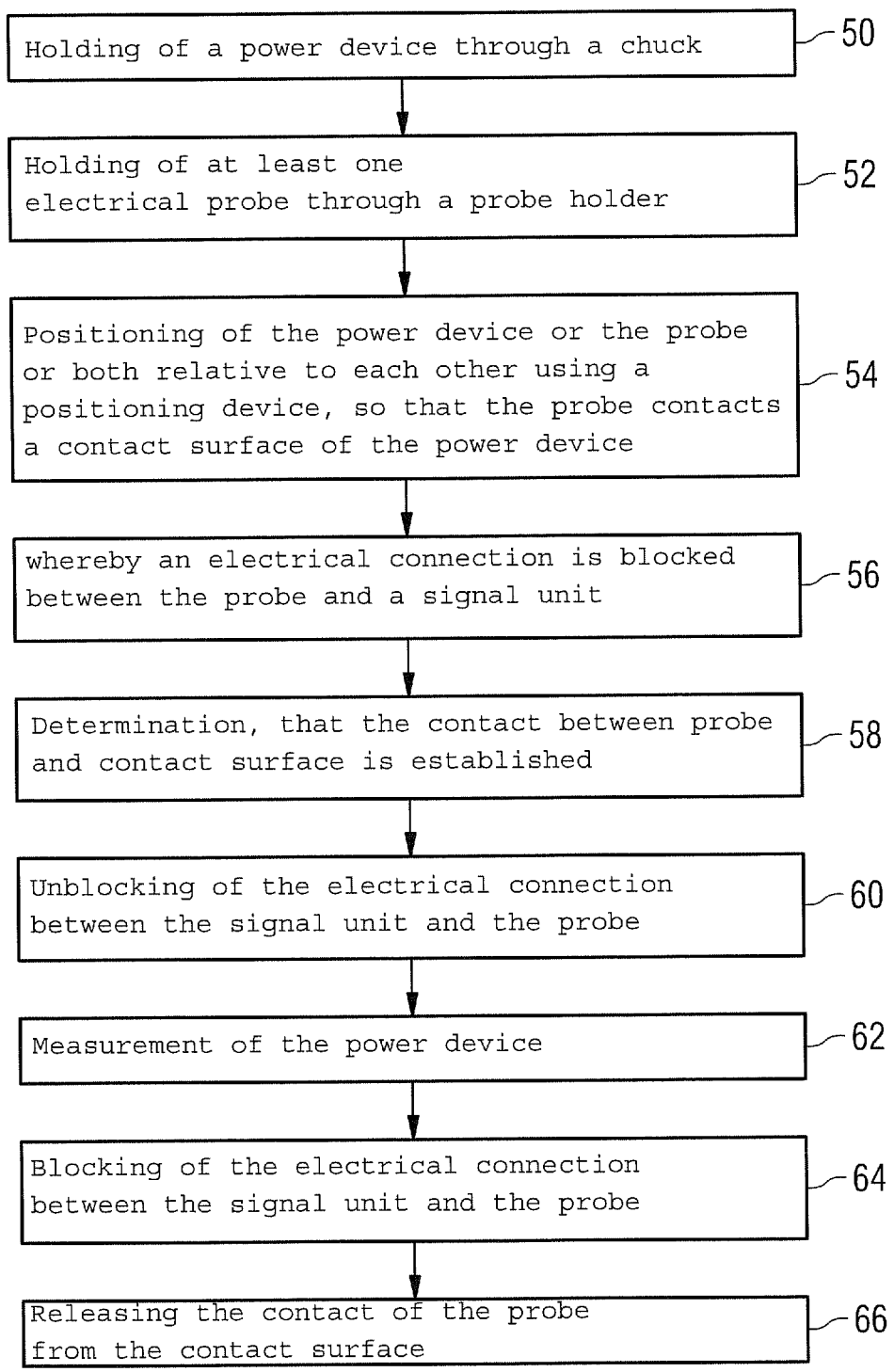

METHOD FOR MEASUREMENT OF A POWER DEVICE

A method is disclosed for the measurement of semiconductor devices of power electronics, of wafers with such devices, and power electronic systems, in the following generally designated as power devices, in a measurement device that is suitable for examining and testing of electronic components, which is generally designated as a prober.

Semiconductor devices of the power electronics are understood in the following as electronic components arranged in a semiconductor, that are characterized in particular through a high current and high-power handling capability and a high blocking capacity. Components of the power electronics in particular are components with switching functions that are used under high electronic and physical requirements and high switching frequencies with steep current and voltage fluctuations, such as diodes, thyristors, MOSFETs, IGBTS or others. Such a power device or a wafer, which comprises a series of such devices, is also known to the expert in connection to a measurement as a "Device Under Test—DUT."

In a prober, a power device is subject to various measurements for examining purposes or for tests or for investigating its parameters, whereby a measurement can be carried out under special environmental conditions. For the measurement, the power device is contacted by a test probe (probe) to feed in or tap a signal. For this purpose, a contact surface of the power device and a probe have to be positioned relative to each other, and have to be brought into contact with each other. Frequently, several contact surfaces are contacted simultaneously by several probes. One step of the method, that influences the course of the measurement, is the moving of the power device or of the probe or both components relative to each other for creating their contact.

The positioning of the power device and the contacting takes place traditionally mostly using electric drives, whereby re-adjustments can also be necessary. With starting to move the contact surfaces of the power devices, there is a danger that unintentional discharges can occur because of the high voltage or current signals that are required for the measurement of these components. These can be caused, for instance, through faulty measuring procedures such as connecting the signal unit before the contact or during a re-adjustment, and can lead to damage of the component or of the probe, possibly also a melding of the test probes onto the contact areas. The danger of discharge is present as well with automated or semi-automated as and in particular with manual measuring procedures if the test probe in the process of approaching the contact surface is less than a certain distance away.

For that reason, the purpose of the present invention is avoiding a possible automation of the arc formation between a probe and a contact surface of a power device while its measurement is avoided, and to reduce the time needed for each single measurement, and thus, to make the measurement more efficient.

Using the method according to the invention, following a temporary blockage of the signal unit, any formation of an arc between probe and contact surface is avoided. The blockage is inextricably connected to the determination of the contact of the probe on the contact surface, i.e. to the determination of a so-called 'contact mode,' and causes the measurement signal not to be applied between probe and power device during the positioning.

It is to be noted that the unblocking of the signal unit, which could already be determined through the course of time of positioning, is not merely associated with the formation of the contact, but that meeting the requirements of the contact is actively determined. This becomes increasingly important in particular for contacting a power device through several probes simultaneously as according to one embodiment of the method, the unblocking of the signal unit only takes place when a secure mechanical and thus, electrical contact is determined for each probe.

An activation of the electrical connection between the signal unit and the probe takes place only after a final approaching movement which is basically suitable and defined to form a contact between the probe and the power device. Ordinarily, the movement will occur in z-direction, i.e. in a vertical direction. Depending on the shape and order of the probe and/or power device, this can be a different movement. The determination of the 'contact mode' occurs therefore through defining a point of time for the 'contact mode' using technical parameters; this is completion of a movement in the direction of the power device until a contact with the probe has been achieved. Thus, an influencing of the unblocking of the signal unit can be ruled out, and technical parameters can be used now for purposes of automation.

In addition through providing technical parameters for unblocking the signal unit, a reduction of the time needed until the measurement signal is to be fed in or tapped is possible which increases the throughput of more units during the examination.

In which way the unblocking takes place can be adjusted respectively to the size of measurement, the conditions and parameters of the measurement, the power device or according to other requirements. Generally, this can be realized using mechanical, optical or electric means.

Accordingly, for determining the 'contact mode,' e.g. the positioning device can be designed, through which the relative movement between one or several probes and the power device can take place for the purpose of contacting, or an observation unit or even the measurement unit itself which comprises the signal unit and serves the control of the measurement. For the latter, the signal unit is separable and connectable from the measurement unit via a suitable circuit. Using a contact sensor unit that is independent from this, the formation of the contact between probe and contact area can be determined.

As a contact sensor unit for determining the contact, either the probes themselves or complementing reference probes can be used, whereby the latter are positioned and contacted together with the probes. Signals from the reference probes additionally via geometrical or temporal references can be processed in a way that the course of time necessary for protecting the measurement order between determining the contact and unblocking the electrical connection can be achieved. Also, signals from contact sensors or distance sensors can be used in a similar way to unblock the electrical connection.

The invention shall be described further in the following using various embodiments. The associated drawings shown in FIG. 1 an embodiment of a prober for the measurement of a power device in schematic representation, FIG. 2 a diagram for the representation of a method for measurement of a power device.

In one embodiment of a prober, which is presented schematically in FIG. 1, a power device 20, generally designated also as DUT (Device Under Test), is arranged on a chuck 22. The chuck 22 has a X-Y-Z-θ cross table 24 for moving the chuck 22 and thus, the power device 20. This cross table 24 enables a movement in both directions on an x-y plane, which is defined as parallel positioned to the receiving surface of the chuck 22. It additionally enables a movement in relation to the x-y plane vertical z-direction, and a rotation of an angle theta (θ) around an in z-direction lying axis. The angular alignment of the chuck 22 occurs using a theta-drive at the cross table 24 to adjust a defined angle θ of a reference line or reference edge of the power device 20 relative to the x- or y-direction. The execution of the single movements on x-y plane or in z-direction, and the angular alignment take place each using an own drive through which single or all of them can be operated electrically.

In the embodiment according to FIG. 1, a plurality of probes 26 are held in two opposite to each other positioned rows of which only the first one is visible in the line of vision. The arrangement of the probes 26 corresponds to the arrangement of the contact areas 21 of the to be measured power device 20.

As probe holder 28 of one or several probes 26, various probe holders 28 are known depending on, e.g. the power device 24, the to be fed in or tapped test signals, or the required sequences of movements in the prober during one measurement or between two measurements. For instance, the probes 26 are mounted onto a probe board (FIG. 1), through which the alignment and fixation of the probes 26 to each other and for the arrangement of the simultaneously to be contacted contact surfaces 21 of the power device 20 as well as the establishing of an electrical connection from the probes 26 to an interface for connecting a measurement unit take place. Such probe boards usually do not include their own manipulator unit; they are positioned prior to a measurement or series of measurements relative to the chuck 22 and thus, suitably for the power device, and remain in this position. In this instance, the movements for positioning and contacting take place during a measurement solely through the chuck 22.

In another, not represented embodiment, the probes 26, individually or assembled in groups, are mounted to so called probe heads. Also, the probe heads serve the alignment, fixation, and electrical connection of the probe or probes 26, however additionally comprise a manipulator unit that serves the moving of the probe heads, and is operated manually or motorized. The combination of the movements that can be executed through a manual or motorized manipulator unit is comparable to the movements of a chuck 22.

In various embodiments, the manipulator unit can carry out one or all of the movements that are described above for the chuck 22, whereby the movements that can be realized through the manipulator unit each take place by means of an individual drive. Also, these drives can be operated selectively or in unison electrically.

The X-Y-Z-θ cross table 24 of the chuck 22 as well as an optional manipulator unit of the probe holder 28 are components of the positioning device of the prober and correspond to each other.

Via an interface 30, that is comprised by the probe holder 28 in the embodiment, each probe 26, through which a contact is to be established to the power device 20, is connected with a measurement unit 32. The measurement unit 32 comprises a signal unit 34, through which the required measurement signals can be provided or received. The connection of the signal unit 34 to the probes 26 is to be formed manually and/or automated or disconnected via a suitable circuit, which is designated in the following as interlock 36.

As contact sensor unit 27 in the represented embodiment serves all of the probes 26, which also serve the measurement of the power device 20. By means of this contact sensor unit 27, the state of contact will be determined by sending a small subsidiary signal through all probes connected in line, so that an unblocking signal displaying 'contact mode' can only be measured if all of the probes 26 have established a contact on the contact surfaces 21. Through this unblocking signal, the interlock 36 can be controlled directly or indirectly. As far as no 'contact mode' or an associated interruption is determined, the signal unit 34 is blocked. In one embodiment of the method, such interlock events can be displayed, and/or following a re-establishment of the 'contact mode,' an automatic unblocking or blocking of the signal unit 34 can take place.

As far as such a circuit connecting the probes 26 in line is not supported by the power device 20, other, e.g. optical or mechanical methods for determining the contact and initiating an unblocking or blocking signal can be used.

In one embodiment, the establishing of the contact position can be visually determined, or through image processing using an optical device 40, so that a blocking or unblocking of the signal unit 34 can take place by means of optically initiated signals.

In another embodiment, an unblocking signal following the establishing of the 'contact mode,' or a blocking signal for controlling the signal unit 34 via a control unit 42 of the positioning device, in this embodiment that of the chuck, is generated after a pre-determined z-distance is covered which is identified prior for the formation of a secure contact.

A positioning and contacting procedure shall be described as part of measurement of a power device 20 using FIG. 2. In one first embodiment of the method, a power device 20 is initially applied to the receiving surface of a chuck 22, and held by the chuck 22, 50.

Opposite to the power device 20, at least one probe 26 is arranged by being held by a probe holder 28, 52.

In the following, the power device 20 or probe 26 or both are positioned relative to each other through a positioning device, so that the probe 26 mechanically and electrically safely contacts a contact surface 21 of the power device 54. The course of positioning and contacting is realized in one embodiment of the method using the x-y-z-θ cross table 24 with two electrical drives for moving the chuck on the x-y plane (x and y-drive) and with an electrical drive for moving the chuck 22 in z-direction (z-drive). The description refers, for the purpose of a better overview, to the positioning for forming the contact between a probe 26 and a contact surface 21 of the power device 20, however occurs during the simultaneous contacting of several contact surfaces 21 using several probes 26 in the same way, as the arrangement of the probes 26 at the probe holder to each other is formed in such a way, that it corresponds with the arrangement of the contact surfaces 21 to each other.

The probe 26 and the power device 20 are held relative to each other by the chuck 22 and probe holder 28 in such a way 50, 52, that the tip of the probe 26, independent of its position on the x-y plane, in z-direction consistently has a positive distance to the contact surface 21 of the power device 20, which is to be overcome using the z-drive. The control of the three drives takes place by means of a control unit 42, which is part of the positioning device.

Starting from a start position, the power device 20, and thus, its contact surface, is moved on the x-y plane, using both drives of the chuck 22, to one measurement position, in which, in contrast to the contact position, the position of the contact surface 21 on the x-y plane are congruent to the position of the probe 26 on this plane, however using the prior adjusted z-distance. The movement to the measurement position can be composed of, e.g. several sub-steps, or only comprise one step in one direction. The latter applies, e.g. if a grid of semiconductor components are to be scanned on a wafer and the grid is coordinated with the x and y-direction.

Subsequently, the approaching movement of the contact surface 21 towards the probe 26 in the z-direction takes place until the tip of the probe 26 securely touches the contact surface 21 (contact position). During the positioning and contacting procedure, a continuous examination takes place of the mode of the contact between probe 26 and contact surface 21 of the power device 20, whereby the electrical connection between probe 26 and the signal unit 24 is blocked through the interlock 36, 56.

As far as prior or during the course of moving closer, a variance of the angle between the required and the actual approach movement, e.g. because of a divergence from the established measurement position to the required one, the approaching movement can be interrupted or undone to carry out a correction of the measurement position on the x-y plane. In this case, a subsequent correction of a probe 26 close to a contact surface 21 is not problematic because as a result of a disconnected connection to the signal unit 34, no measurement signal is yet applied to the probe 26.

In the same way, further movements for contacting the power device 20 can be required if several contact surfaces 21 of a power device 20 using several probes 26 are contacted. In these embodiments of the method, movements on the x-y plane and in the z-direction can also occur by means of an above described manipulator unit of the probe holder 28. For instance, a rough positioning of the chuck 22 can be complemented by a fine positioning of the probes 26. In this case, the adjustment of the measurement position through suitable combination of the movements of the chuck 22 and the probes 26 take place prior to the approaching movement for establishing the contact position. The determination of the state of contact takes place only if all probe tips are placed on the corresponding contact surface 21 of the power device 20.

Through establishing the contact position, an unblocking signal is generated, which determines reaching the 'contact mode' 58, and displays it, following which the interlock 36 unblocks the signal unit 34, 60. Only following this unblocking, the measurement of the power device 20 commences 62.

As reaching the 'contact mode' is interconnected with determining the contact between probe 26 and contact surface 21 and thus, with by technique of measurement detectable parameters, it is disconnected from the actual execution of a measurement, so that the prober functions as a master and the prober connected measurement unit 32 functions as a slave.

Following the measurement of a power device 20, in another embodiment of the method, the next, e.g. the adjacent power device on a wafer, can be measured. To interrupt the contact between probe 26 and contact surface 21 without any problems, the electrical connection between signal unit 34 and probe 26 is blocked again after completion of the measurement of the first power device 20, 64. For this purpose, a blocking signal will be generated using a signal unit 34, following which the electrical connection between signal unit 34 and probe 26 is blocked again using an interlock 36. Only following that, the contact is released, e.g. through lowering the chuck 22, 66, and a new positioning and contacting procedure can commence.

The invention claimed is:

1. A method for measuring an electrical characteristic of a device under test (DUT), wherein the DUT includes a power device, the method comprising:
mounting the DUT within a prober, wherein the prober includes a chuck, a test probe, and a signal unit, wherein the DUT includes a semiconductor device that is configured for high voltage and high power operation, and further wherein the test probe is configured to selectively provide electrical communication between the signal unit and a contact area of the DUT;
blocking an electrical connection between the signal unit and the test probe when the test probe is not in electrical communication with the contact area;
unblocking the electrical connection between the signal unit and the test probe when the test probe is in electrical communication with the contact area; and
measuring the electrical characteristic of the DUT subsequent to the unblocking, wherein the measuring includes providing at least one of a high voltage test signal and a high power test signal from the signal unit to the DUT.

2. The method of claim 1, wherein, subsequent to the measuring, the method further includes re-blocking the electrical connection between the signal unit and the test probe, and further wherein the method includes ceasing the electrical communication between the test probe and the contact area, wherein the re-blocking is performed prior to the ceasing.

3. The method of claim 2, wherein the ceasing includes at least one of moving the test probe away from the DUT and moving the DUT away from the test probe.

4. The method of claim 1, wherein the method further includes forming the electrical communication between the test probe and the contact area, wherein the forming includes establishing an electrical contact between the test probe and the contact area.

5. The method of claim 4, wherein the method further includes at least one of generating a blocking signal prior to the forming and generating an unblocking signal subsequent to the forming.

6. The method of claim 5, wherein the method further includes at least one of blocking the electrical connection responsive to generating the blocking signal and blocking the electrical connection responsive to not generating the unblocking signal.

7. The method of claim 5, wherein the method further includes at least one of unblocking the electrical connection responsive to generating the unblocking signal and unblocking the electrical connection responsive to not generating the blocking signal.

8. The method of claim 5, wherein the signal unit forms a portion of a measurement unit, and further wherein at least one of the blocking signal and the unblocking signal is generated by the measurement unit.

9. The method of claim 8, wherein, prior to the unblocking, the method includes providing a small subsidiary signal to the test probe with the measurement unit, and further wherein the generating includes at least one of generating the blocking signal responsive to determining that the small subsidiary signal is not being provided to the contact area and generating the unblocking signal responsive to determining that the small subsidiary signal is being provided to the contact area.

10. The method of claim 9, wherein the small subsidiary signal includes at least one of a lower voltage, a lower current, and a lower power than a test signal that may be provided to the DUT by the signal unit during the measuring.

11. The method of claim 5, wherein forming the electrical communication includes positioning the contact area of the DUT and the test probe with respect to one another with a positioning device that is configured to control a relative motion of the contact area of the DUT and the test probe.

12. The method of claim 11, wherein the positioning device includes a control unit that is configured to control the operation of the positioning device, and further wherein the generating includes at least one of generating the blocking signal responsive to the control unit determining that the test probe is not in electrical communication with the contact area and generating the unblocking signal responsive to the control unit determining that the test probe is in electrical communication with the contact area.

13. The method of claim 5, wherein the prober further includes an optical device, wherein the method further includes optically determining that the electrical contact between the test probe and the contact area has been established, and further wherein the generating includes at least one of generating the blocking signal and generating the unblocking signal responsive to the optically determining.

14. The method of claim 1, wherein the blocking includes obstructing the electrical connection between the signal unit and the test probe, and further wherein the unblocking includes providing the electrical connection between the signal unit and the test probe.

15. The method of claim 1, wherein the prober includes a plurality of test probes, wherein the DUT includes a plurality of contact areas, wherein each of the plurality of test probes is configured to selectively provide electrical communication between the signal unit and a respective contact area of the plurality of contact areas, wherein the blocking includes blocking the electrical connection when at least one of the plurality of test probes is not in electrical communication with the respective contact area, and further wherein the unblocking includes unblocking the electrical connection when each of the plurality of test probes are in electrical communication with the respective contact area.

16. The method of claim 1, wherein the method further includes actively determining a contact status between the test probe and the contact area, wherein the contact status includes at least one of a contact mode in which the test probe is in electrical communication with the contact area and a non-contact mode in which the test probe is not in electrical communication with the contact area, and further wherein the actively determining does not include providing an electric current from the signal unit to the contact area.

17. The method of claim 1, wherein the prober includes an interlock circuit, wherein the blocking includes creating an open circuit between the signal unit and the test probe with the interlock circuit, and further wherein the unblocking includes providing a closed circuit between the signal unit and the test probe with the interlock circuit.

18. A prober comprising:
a chuck;
a test probe;
a signal unit; and
an electronic controller that is programmed to perform the method of claim 1.

19. The prober of claim 18, wherein the prober further includes an interlock circuit that is configured to selectively establish an electrical connection between the signal unit and the test probe responsive to receipt of a control signal from the electronic controller.

* * * * *